US008605778B2

(12) United States Patent
Eliezer

(10) Patent No.: US 8,605,778 B2
(45) Date of Patent: Dec. 10, 2013

(54) ADAPTIVE RADIO CONTROLLED CLOCK EMPLOYING DIFFERENT MODES OF OPERATION FOR DIFFERENT APPLICATIONS AND SCENARIOS

(71) Applicant: XW LLC, Dallas, TX (US)

(72) Inventor: Oren E. Eliezer, Plano, TX (US)

(73) Assignee: XW LLC, Dallas, TX (US)

( * ) Notice: Subject to any disclaimer, the term of this patent is extended or adjusted under 35 U.S.C. 154(b) by 0 days.

(21) Appl. No.: 13/678,223

(22) Filed: Nov. 15, 2012

(65) Prior Publication Data

US 2013/0121400 A1 May 16, 2013

Related U.S. Application Data

(60) Provisional application No. 61/559,966, filed on Nov. 15, 2011.

(51) Int. Cl.
*H03K 9/08* (2006.01)

(52) U.S. Cl.
USPC .......................................................... 375/238

(58) Field of Classification Search
USPC ............................................... 375/238; 428/8
See application file for complete search history.

(56) References Cited

U.S. PATENT DOCUMENTS

| | | | |
|---|---|---|---|
| 3,406,343 | A | 10/1968 | Mehlman |
| 3,648,173 | A | 3/1972 | Elliott |
| 4,117,661 | A | 10/1978 | Bryant, Jr. |
| 4,217,467 | A | 8/1980 | Kobayashi et al. |
| 4,500,985 | A | 2/1985 | Chang |
| 4,525,685 | A | 6/1985 | Hesselberth et al. |
| 4,562,424 | A | 12/1985 | Takagi et al. |
| 4,768,178 | A | 8/1988 | Conklin et al. |
| 4,925,299 | A | 5/1990 | Meisberger et al. |
| 5,805,647 | A | 9/1998 | Schafer et al. |
| 6,041,082 | A | 3/2000 | Takeda et al. |
| 6,124,960 | A | 9/2000 | Garthe et al. |
| 6,212,133 | B1 | 4/2001 | McCoy et al. |
| 6,295,442 | B1 | 9/2001 | Camp, Jr. et al. |
| 6,862,317 | B1 | 3/2005 | Mohan et al. |
| 6,937,668 | B2 | 8/2005 | Sidharan et al. |

(Continued)

OTHER PUBLICATIONS

Lichtenecker, R. “Terrestrial time signal dissemination”, Real-Time Systems, 12, pp. 41-61, Kluwer Academic Publishers, Boston MA, 1997.

(Continued)

*Primary Examiner* — Khai Tran
(74) *Attorney, Agent, or Firm* — Howard Zaretsky, Esq.; Woods Oviatt Gilman, LLP

(57) ABSTRACT

A configurable system and method for a radio controlled clock (RCC) receiver adapted to apply different strategies for extracting timing and time information from a phase modulated signal depending on the type of application the RCC is used in and on the reception conditions. The official time signal is broadcast from a central location using a modulation scheme which includes phase modulation that alternates between different information rates, allowing for multiple alternative reception modes that are suited for different ranges of signal-to-interference-and-noise-ratio (SINR). The operation of the RCC is configured by the application that hosts it, such that the reception performance and the energy consumption best suit that application. The reception mode used by the RCC at a given time may be selected automatically, i.e. without user intervention, based on the device's profile of operation and the reception conditions.

19 Claims, 4 Drawing Sheets

(56) References Cited

U.S. PATENT DOCUMENTS

| | | | |
|---|---|---|---|
| 7,027,773 B1 | 4/2006 | McMillin | |
| 7,215,600 B1 | 5/2007 | DeRosa | |
| 7,324,615 B2 | 1/2008 | Lourens et al. | |
| 7,411,870 B2 | 8/2008 | Murata et al. | |
| 7,636,397 B2 | 12/2009 | McLaughlin | |
| 7,719,928 B2 | 5/2010 | Meltzer et al. | |
| 7,720,452 B2 | 5/2010 | Miyahara et al. | |
| 7,738,322 B2 | 6/2010 | Murata et al. | |
| 7,750,612 B2 | 7/2010 | Yokosawa | |
| 7,956,778 B2 | 6/2011 | Koyama | |
| 7,974,580 B2 | 7/2011 | Fagg | |
| 8,300,687 B1 * | 10/2012 | Eliezer | 375/238 |
| 2003/0169641 A1 | 9/2003 | O'Neill et al. | |
| 2004/0196926 A1 | 10/2004 | Chien et al. | |
| 2004/0239415 A1 | 12/2004 | Bishop | |
| 2005/0036514 A1 | 2/2005 | Polonio et al. | |
| 2005/0073911 A1 | 4/2005 | Barnett | |
| 2005/0105399 A1 | 5/2005 | Strumpf et al. | |
| 2005/0111530 A1 | 5/2005 | Chen et al. | |
| 2005/0141648 A1 | 6/2005 | Lourens et al. | |
| 2005/0169230 A1 | 8/2005 | Haefner | |
| 2005/0175039 A1 | 8/2005 | Haefner et al. | |
| 2005/0213433 A1 | 9/2005 | Mah | |
| 2006/0140282 A1 | 6/2006 | Kondo | |
| 2007/0089022 A1 | 4/2007 | McLaughlin | |
| 2007/0115759 A1 | 5/2007 | Sano | |
| 2007/0140064 A1 | 6/2007 | Fujisawa | |
| 2007/0164903 A1 | 7/2007 | Takada | |
| 2008/0049558 A1 | 2/2008 | Shimizu | |
| 2008/0095290 A1 | 4/2008 | Leung | |
| 2008/0107210 A1 | 5/2008 | Haefner | |
| 2008/0239879 A1 | 10/2008 | Someya | |
| 2009/0016171 A1 | 1/2009 | Fujisawa | |
| 2009/0054075 A1 | 2/2009 | Boejer et al. | |
| 2009/0122927 A1 | 5/2009 | Walton et al. | |
| 2009/0254572 A1 * | 10/2009 | Redlich et al. | 707/10 |
| 2009/0274011 A1 | 11/2009 | Fujisawa | |
| 2011/0051561 A1 | 3/2011 | Fujisawa | |
| 2011/0084777 A1 | 4/2011 | Wilhelm | |
| 2011/0129099 A1 | 6/2011 | Fagg | |
| 2012/0082008 A1 | 4/2012 | Eliezer et al. | |

OTHER PUBLICATIONS

Cherenkov, G.T. "Employment of phase modulation to transmit standard signals", Plenum Publishing Corporation, 1984.

PCT International Search Report and Written Opinion, PCT/US2012/049029, Dec. 26, 2012.

Hetzel, P., Time Dissemination via the LF Transmitter DCF77 using a Pseudo-Random Phase-Shift Keying of the Carrier, 2nd EP Freq & Time Forum, Session TF-05, No. 3, Mar. 16, 1988.

Lombardi, Michael A., NIST Time and Frequency Services, NIST Special Publication 432, Jan. 2002 Edition.

Lombardi, Michael A. et al., WWVB Radio Controlled Clocks: Recommended Practices, Special Publication 960-14, 2009 Edition.

Lowe, John, We Help Move Time Through the Air, RadioWorld, vol. 35, No. 8, Mar. 23, 2011.

Tele Distribution Francaise, http://en.wikipedia.org/Tele_Distribution_Francaise.

DCF77, http://en.wikipedia.org/wiki/DCF77#Phase_modulation.

WWVB, http://en.wikipedia.org/wiki/WWVB.

US Dept of Commerce, NIST, FY 2010 Small Business Innovation Research Program Solicitation, NIST-10-SBIR, Oct. 30, 2009-Jan. 22, 2010.

Allen, K.C., Analysis of Use of 10 or 20 dB Amplitude Shifting for WWVB at 60 kHz, National Telecommunication & Information Administration, Apr. 25, 2005.

Deutch, Matthew et al., WWVB Improvements: New Power from an Old Timer, 31st Annual Precise Time and Time Interval (PTTI) Meeting, Dec. 7-9, 1999.

Piester, D. et al., PTB's Time and Frequency Activities in 2006: New DCF77 Electronics, New NTP Servers, and Calibration Activities, Proc. 38th Annual PTTI Mtg, Dec. 5-7, 2006.

Bauch, A. et al., PTBM, Special Topic—50 Years of Time Dissemination with DCF77, Special Issue, vol. 119 (2009), No. 3.

Lombardi, Michael A., Radio Controlled Clocks, NIST Time and Frequency Division, NCSL International Workshop and Symposium, 2003.

Chen, Yin et al., Ultra-Low Power Time Synchronization Using Passive Radio Receivers, IPSN '11, Apr. 12-14, 2011.

Lowe, J. et al., Increasing the Modulation Depth of the WWVB Time Code to Improve the Performance of Radio Controlled Clocks, Int'l Freq Control Symp & Expo, IEEE, Jun. 2006.

* cited by examiner

ADAPTIVE RADIO CONTROLLED CLOCK EMPLOYING DIFFERENT MODES OF OPERATION FOR DIFFERENT APPLICATIONS AND SCENARIOS

REFERENCE TO PRIORITY APPLICATION

This application claims priority to U.S. Provisional Application Ser. No. 61/559,966, filed Nov. 15, 2011, entitled "Reception of Time Information and Synchronization Information in a Radio Controlled Clock," incorporated herein by reference in its entirety.

FIELD OF THE INVENTION

The present invention relates to the field of wireless communications, and more particularly relates to a configurable radio controlled clock receiver adapted to extract timing and time information from a phase modulated signal.

BACKGROUND OF THE INVENTION

Radio-controlled-clock (RCC) devices that rely on time signal broadcasts have become widely used in recent years. A radio-controlled-clock (RCC) is a timekeeping device that provides the user with accurate timing information that is derived from a received signal, which is broadcast from a central location, to allow multiple users to be aligned or synchronized in time. Colloquially, these are often referred to as "atomic clocks" due to the nature of the source used to derive the timing at the broadcasting side. In the United States, the National Institute of Standards and Technology (NIST) provides such broadcast in the form of a low-frequency (60 kHz) digitally-modulated signal that is transmitted at high power from radio station WWVB in Fort Collins, Colo. The information encoded in this broadcast includes the official time of the United States. This also includes information regarding the timing of the implementation of daylight saving time (DST), which has changed in the United States over the years due to various considerations.

Reception challenges created the need for a new broadcast format, or communications protocol, for time signal broadcasts, that would allow for robust reception in various types of applications under various reception conditions while also being cost-effective. The new broadcast format, operating in accordance with the present invention, preserves the amplitude modulation and pulse-width modulation properties of the legacy time-code broadcast. This backward-compatibility property ensures that the operation of legacy devices, is not unaffected by the additional features offered by the enhanced broadcast format.

SUMMARY OF THE INVENTION

The present invention is a system and method for an adaptive and configurable radio controlled clock receiver adapted to extract timing and time information from a phase modulated signal that, in one embodiment, is transmitted over a pulse-width modulation/amplitude-modulated signal. The modulation scheme employed by the transmitter operating in accordance with the present invention includes multiple different representations of phase-modulated time and timing information that are broadcast alternately to allow for optimized reception at different ranges of SINR values.

The configurable system and method is operative to apply different strategies for extracting timing and time information from a phase modulated signal depending on the type of application the RCC is used in and on the reception conditions. The official time signal is broadcast from a central location using a modulation scheme which includes phase modulation that alternates between different information rates, thereby allowing for multiple alternative reception modes that are suited for different ranges of signal-to-noise-and-interference-ratio (SINR). The operation of the RCC is configured by the application that hosts it, such that the reception performance and the energy consumption best suit that application. Different profiles of operation are defined for different types of applications, such that an appropriate one is selected in the RCC in accordance with an indication of application-type that is provided by the host (e.g., wristwatch, microwave oven, car clock). The reception mode used by the RCC at a given time may be selected automatically, i.e. without user intervention, based on the device's profile of operation and the reception conditions.

There is thus provided in accordance with the invention, a radio receiver method, said method comprising receiving a phase modulated (PM), pulse width modulated (PWM)/amplitude shift keyed (ASK) broadcast signal encoded with phase-modulated time information frames, extracting said time information frames from the phase of said received signal, and operating said radio receiver in accordance with a predefined profile adapted for a particular type of application host.

There is also provided in accordance with the invention, a radio controlled clock (RCC), comprising a receiver coupled to an application host, said receiver operative to receive a phase modulated (PM), pulse width modulated (PWM)/amplitude shift keyed (ASK) broadcast signal encoded with phase-modulated time information frames, and extract said time information frames from the phase of said received signal, and at least one profile adapted to operate said receiver in accordance with one or more parameters optimized for a particular type of application host.

There is further provided in accordance with the invention, a radio receiver method, said method comprising receiving a phase modulated (PM), pulse width modulated (PWM)/amplitude shift keyed (ASK) broadcast signal encoded with phase-modulated time information frames, extracting said time information frames from the phase of said received signal, operating said radio receiver in accordance with a predefined profile adapted for a particular type of application host, and adaptively attempting reception at multiple different symbol rates allowing for optimized reception for different conditions.

BRIEF DESCRIPTION OF THE DRAWINGS

The invention is herein described, by way of example only, with reference to the accompanying drawings, wherein.

DETAILED DESCRIPTION OF THE INVENTION

Figure 1:
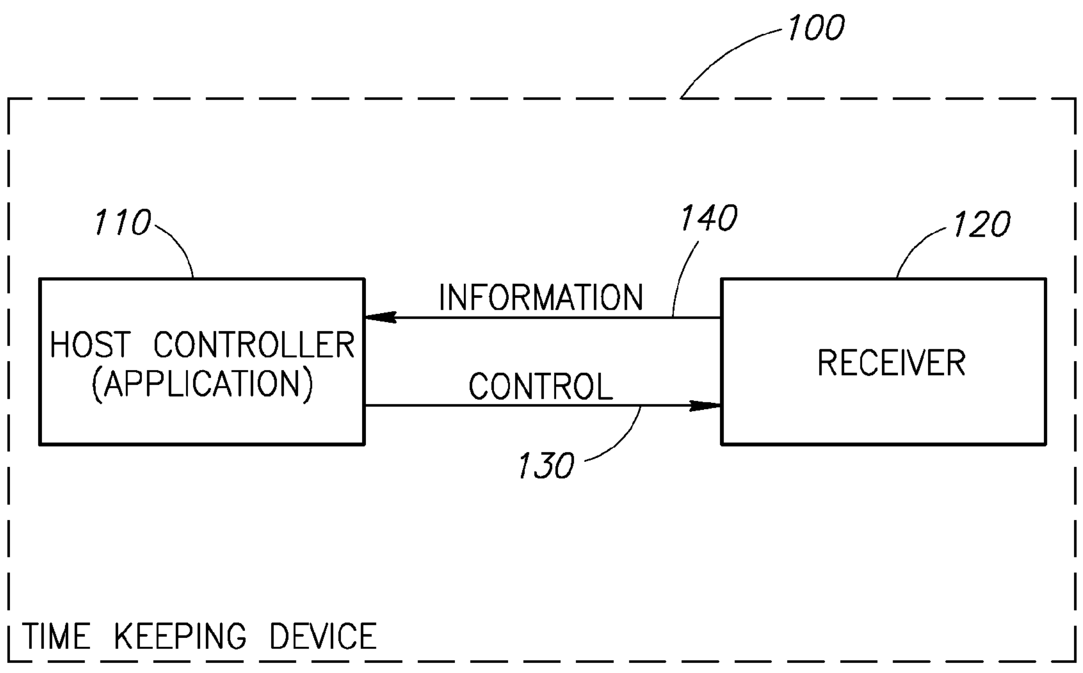
FIG. 1 is a high level block diagram illustrating a receiving device operating in accordance with the present invention within a hosting application.

A high level block diagram illustrating an example receiving device operating in accordance with the present invention within a hosting application is shown in FIG. 1. The time keeping device, generally referenced 100, comprises a host environment that may represent a microwave oven, car, wall-clock, watch or any other device where the receiver 120 of the present invention may be incorporated. The host controller 110 is operative to inform the receiver through a control bus 130 what type of operation profile is preferred. Alternatively, such information may be hardwired such that the receiving device is either pre-programmed to use a specific operating profile for this hosting application or reads the selected operating profile from an input port that has a fixed word applied to it externally, such that no input would be necessary from the host controller.

The receiver 120 provides the host with time and timing information through a communications bus 140, which may be serial, parallel or wireless. Additional information that may be conveyed from the receiver to the host through this bus could include received messages and receiver status notifications (e.g., SINR conditions).

Figure 2:
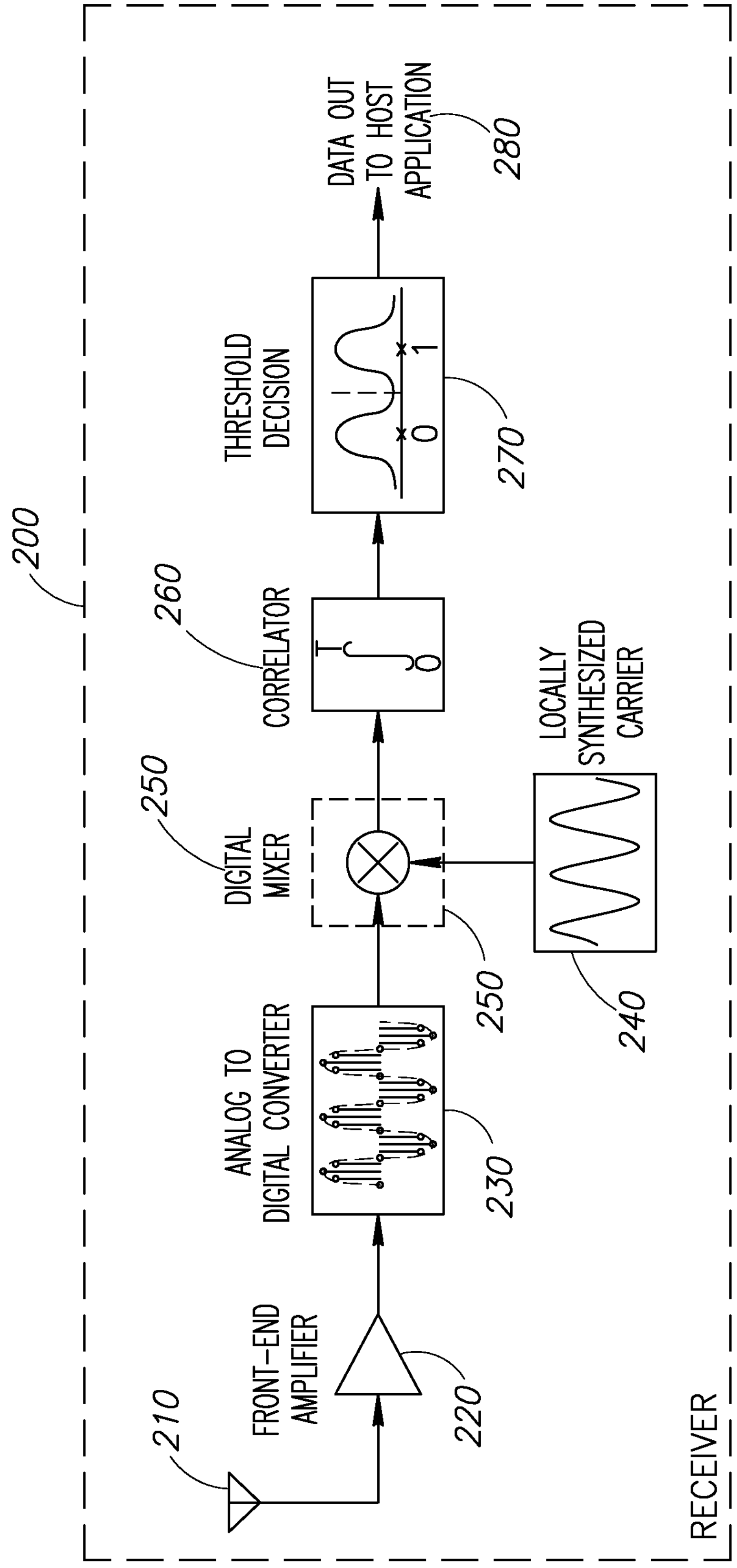
FIG. 2 is a high level block diagram illustrating an example receiver.

A high level block diagram illustrating an example architecture for the receiver is shown in FIG. 2. The receiver, generally referenced 200, comprises antenna 210, front end amplifier 220, analog to digital converter (ADC) 230, digital mixer 250, local oscillator 240, correlator 260 and threshold decision logic or circuit 270. In this example, digital signal processing is assumed to be used for the data recovery operation, wherein the signal from the antenna 210 is first amplified in analog front end 220, then digitized in analog to digital converter 230, then down-converted by digitally synthesized local oscillator source 240 and multiplication operation 250, such that the correlation or matched-filtering operation 260 can be performed at baseband. Decision block 270 decides on the received symbol or word that is to be presented at output 280, which is provided to the host application.

The signal at the transmitter end includes a modulation scheme having multiple different representations of phase-modulated time and timing information that are broadcast alternately to allow for optimized reception at different ranges of SINR values.

For example, in one representation of timing and time information, which is tailored for high SINR values, the timing and time are provided through symbols that are transmitted at a much higher rate than the 1 bit/sec rate that is used for the legacy broadcast of the time information. On the other hand, in another representation that is tailored for very low SINR values, the symbols of 1 bit/sec are replaced with sequences spanning multiple minutes in duration, allowing for greater amounts of energy to be invested in each transmitted symbol, thereby ensuring reliable reception even at very low SINR values.

In one embodiment, the information modulated onto the phase contains a known synchronization sequence, error-correcting coding for the time information and notifications of daylight-saving-time (DST) transitions that are provided months in advance.

The structure and method of operation of the receiver allow the timekeeping functionality of a device to be accurate, reliable and power efficient. In one embodiment, the communication protocol of the present invention is adapted to allow prior-art devices to operate in accordance with a legacy communication protocol that is based on amplitude and pulse-width modulations, such that they are unaffected by the phase modulation that is defined in accordance with the present invention, whereas devices adapted to operate in accordance with the present invention benefit from various performance advantages.

Although this backward-compatibility property of the communication protocol of the present invention may represent a practical need when upgrading an existing system, the scope of the invention is not limited to the use of this modulation scheme and to operation in conjunction with an existing communication protocol.

The performance advantages offered by the present invention include (1) greater reception robustness in the presence of impulse noise and on-frequency jamming; (2) more reliable operation at a much lower SINR; (3) faster acquisition of the timing and time information when SINR conditions permit; (4) possibility of extracting timing more accurately when SINR conditions permit; and (5) reduced energy consumption, which leads to extended battery life in battery-operated devices.

Furthermore, the system is scalable in that it allows for receivers experiencing different reception conditions to use the received signal differently. In particular, the broadcast signal includes different representations for the timing and time information, that are provided simultaneously or alternately at different symbol rates, such that it could be extracted from the broadcast signal in a manner that best suits the application in which the RCC is embedded and the SINR conditions experienced by it at a given instance.

The features described supra serve to greatly increase the robustness and reliability of the RCC devices embedded in various applications and environments, such as in wrist-watches, wall-clocks, cars and microwave ovens, by allowing them to reliably operate at a wide range of SINR values, while also meeting the constraints defined by the application, such as minimized energy consumption or enhanced accuracy requirements.

An integrated circuit (IC), or other realization of the RCC in accordance with the present invention, allows for at least one input parameter from the application hosting it to define its selected profile of operation from amongst several pre-defined profiles of operation that were designed to suit the common needs and constraints found in different types of devices (e.g., energy constrained operation in battery operated devices versus reliable and accurate timing and unconstrained energy consumption in another type of application).

In one embodiment of the invention, the various operating parameters of the RCC may be provided individually by the application, instead of selecting a specific operation profile, for which a set of parameters would already be predefined (e.g., the periodicity and duration of receptions, the targeted symbol rate for reception, the need for date information, the need for dual-antenna based reception).

In general, for a particular application, the time between consecutive adjustments (i.e. the reception period) and the reception duration would depend on the allowable timing drift and current consumption in that application.

Examples of possible different profiles of operation for a RCC designed in accordance with the present invention include: wrist-watch, wall-clock, alarm-clock, car, and appliance (e.g., oven). Possible properties of some of these operating profiles are listed below, alongside with their reasoning:

1. Wrist-watch—receive as infrequently as possible (e.g., once a week) to conserve energy. Between consecutive receptions possibly perform timing corrections based on estimated timing errors. Employ single antenna reception, as the device is not assumed to be stationary and may be given reception opportunities at different orientations. Limit reception to fast mode at night, in order to minimize the duration of synchronization. When repeatedly failing, move up to normal mode (1 bit/sec), but not to extended reception mode.

2. Car—attempt to receive frequently (e.g., once a day), as there is no energy constraint. Allow reception at extended reception mode (sequences spanning multiple minutes) when the higher rate modes repeatedly fail. Employ single antenna reception, as the device is not assumed to be stationary and may be given reception opportunities at different orientations.

3. AC Appliance such as microwave oven—the receiver may operate at high duty cycle and consume more energy. Extended reception mode may be allowed and will likely be needed for indoor reception, particularly during the daytime. Device may employ dual-antenna reception, as it is stationary and placed indoors.

It is noted that different types of time-keeping applications, e.g., a clock in a microwave oven versus a wrist-watch, have different needs and constraints, one of which may be energy limitation as a result of battery-based operation. This calls for an operation strategy that is tailored for each type of application and is designed to effectively address its needs. For example, a battery operated application such as a wrist-watch, where energy consumption poses a constraint, may be configured such that reception is made as infrequent as possible and its duration is minimized, whereas an application operating off the mains AC power, such as a microwave oven, may be permitted to attempt reception more frequently and for longer duration, whenever this offers performances benefits or even whenever it does not.

Furthermore, the operation of the time-keeping device would ideally be optimized based on the reception conditions, such that for a given reception scenario, characterized by a specific signal-to-interference-and-noise (SINR) ratio, the receiver would offer the best possible performance based on a cost function that considers those factors that may be of importance in that application (e.g., energy consumption, speed of acquiring the time from the received signal, timing accuracy, and probability of error in extracted information).

With the broadcast format of the present invention offering multiple representations of the transmitted information, the receiver is provided with different alternative methods for extracting the timing and time information from the received signal, each of which is tailored to a different range of SNIR values.

Figure 3:
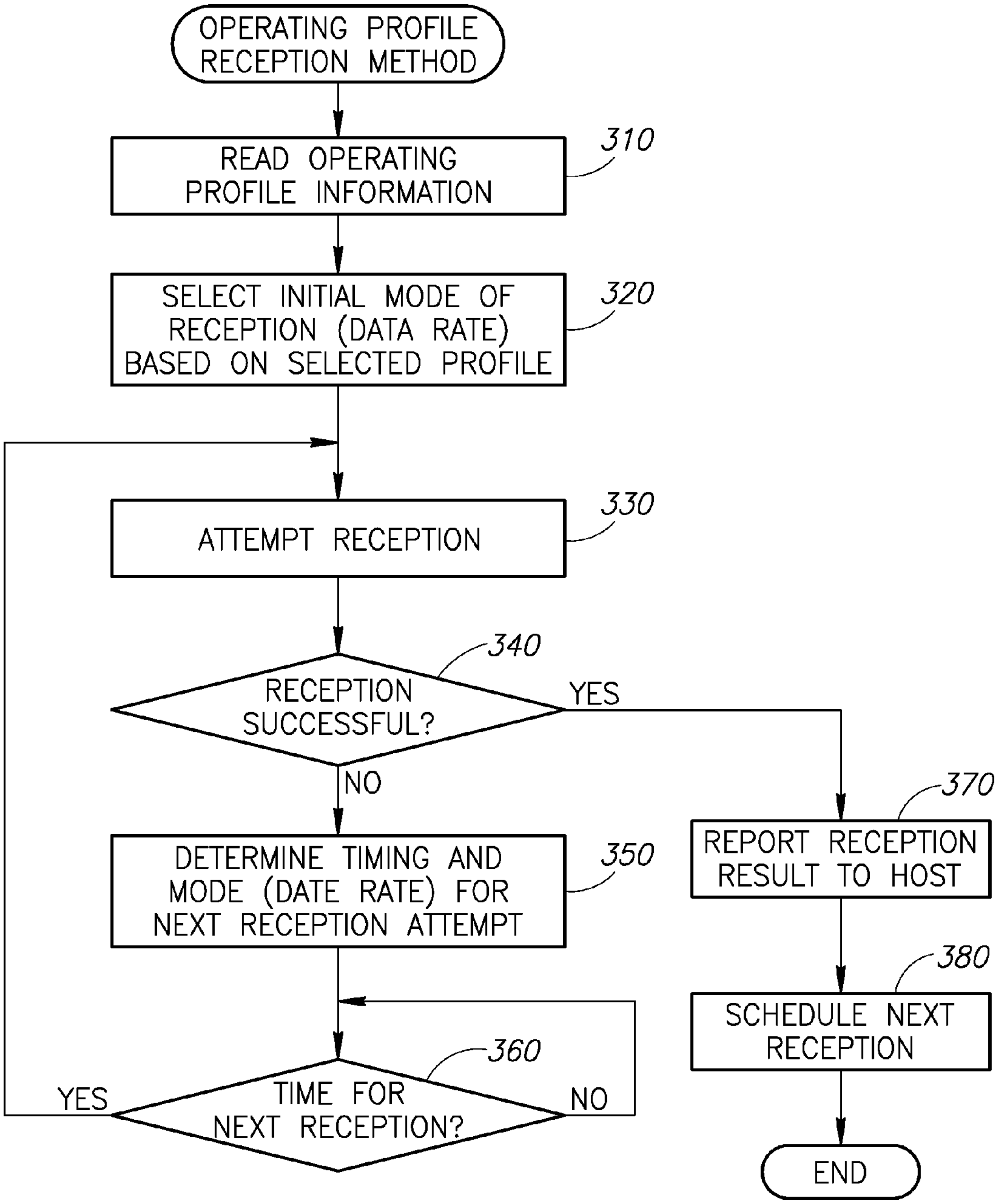
FIG. 3 is a high level flow diagram illustrating how the reception operation in the receiving device is controlled in accordance with the operating profile selected by the host.

A simplified flow diagram illustrating the basic decisions made in the receiving device in response to the selected profile of operation is shown in FIG. 3. A sequence of operations representing an example embodiment of the method of the present invention starts with the identification of the selected operating profile, based on information from the host environment, which may be provided by means of hardwiring, a user input or a control command that is sent via a control bus (step 310). In this step, the receiver sets values for its operating parameters, such as the time between reception attempts, how frequent the tracking operations may be (i.e. timing-drift compensation based on reception of a known sequence in the broadcast signal), what reception modes to use (i.e. fast/normal/extended) and how/when to report results to the host (step 320).

At the appropriate instance, either scheduled or forced, the receiver attempts reception in reception-attempt (step 330), after which a decision will be made regarding the result of this attempt (step 340), based on parameters that are derived from the selected operating profile. If the reception is considered successful in evaluation step 340, the result of the reception is reported to the host (step 370) and the next reception operation, typically for tracking purposes (i.e. only to compensate for timing drift) will be scheduled in scheduling (step 380).

If the evaluation (step 340) determines that the reception attempt was not successful, another such reception attempt (i.e. either for tracking or for acquisition of new information) is scheduled (step 350) based on the set of operating parameters that correspond to the selected operating profile. This includes not only the timing for the next reception attempt (e.g. in how many minutes or hours is another attempt to be made) but also the reception mode that is to be used (e.g., normal 1 bit/sec reception or extended reception, wherein each symbol extends over several minutes). Reception timing step (step 360) determines whether it is time for the next reception based on a previously scheduled reception attempt or on an input from the host, and accordingly invokes such reception (step 330), while using the appropriate operating parameters that are dictated by the operating profile.

Figure 4:
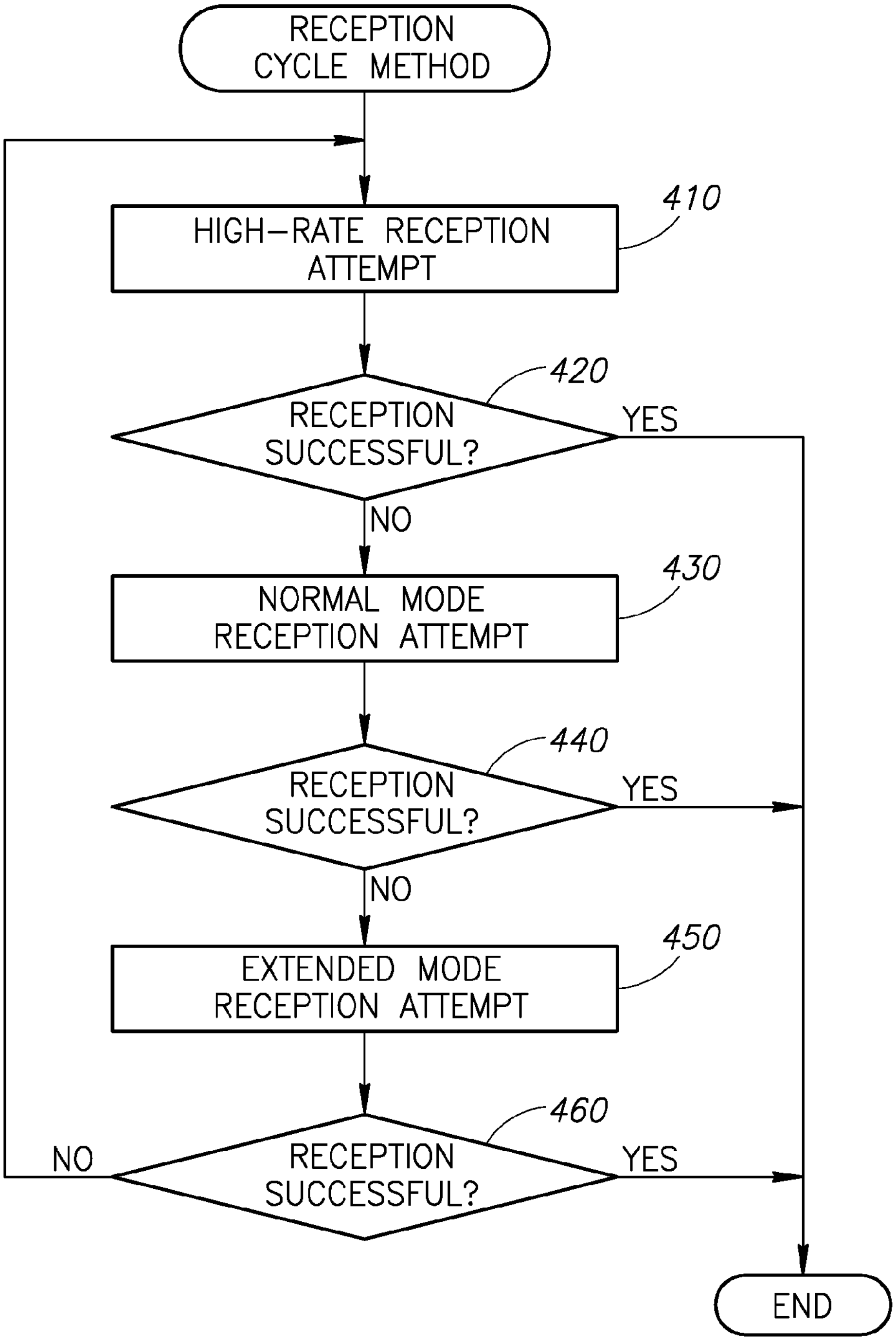
FIG. 4 is a flow diagram illustrating an example cycle of reception attempts that includes all reception modes (i.e. data rates)

A sequence of operations representing an example embodiment of a portion of the method of the present invention is shown in FIG. 4. The sequence of operations may represent the reception-attempt (step 330) shown in the flow diagram of FIG. 3, and, as such, may be implemented as a function that is called by the general reception sequence at step 330.

In this example method, the reception attempt is shown to start in high-rate reception (step 410) with the highest symbol rate, e.g., 100 bits/sec, for which a high SINR would be required for successful recovery of the information from the broadcast (either time and timing information or a message). If reception at the high-rate is determined as unsuccessful (step 420), a normal-mode reception attempt (step 430), e.g., at the lower rate of 1 bit/sec, may be triggered, following which another evaluation operation (step 440) determines whether the last reception attempt was successful.

In another embodiment of the method of the present invention, multiple reception attempts at a high rate may be repeated before the receiver reverts to reception at a lower rate. If evaluation step (step 440) determines that reception at the normal data rate is unsuccessful, and if the selected operating profile for the receiver permits, the receiver attempts reception at the lowest symbol rate in an extended mode reception attempt (step 450), e.g. at a rate of 1 symbol/minute, for which reception may be possible at the lowest SINR values. In a concluding reception evaluation step (step 460) the outcome of the reception attempt is evaluated, and if determined successful and reliable, the reception sequence of operations ends and the reception result is made available. Alternatively, if the reception is considered unsuccessful, the receiver may start a new cycle of attempts which may include the higher rates of reception as well.

The reasoning behind reception attempts at high rate that follow failed reception attempts at lower rates, which are generally capable of receiving at lower SINR, is the following: the reception conditions may vary over time, as the propagation of signals broadcast at low frequencies can depend on the ionosphere, whose properties vary over the course of a day. Additionally, non-stationary interference may vary over time, such that a strongly interfered instance may not represent the SINR that may be experienced at a later instance, and furthermore, certain types of interference, e.g., strong impulses that appear every few seconds, may be more detrimental to victim signals that have longer symbol durations, whereas a repeated message at a high symbol rate may have a chance of being received in between such interfering pulses.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A radio receiver method, said method comprising:

receiving broadcast signal data frames comprising phase modulation (PM) over a legacy pulse width modulated (PWM)/amplitude modulated signal, said broadcast signal encoded with phase-modulated time and timing information;

extracting said time and timing information from the phase of said received signal;

operating said radio receiver in accordance with a predefined profile adapted for a particular type of application host;

wherein information represented by said phase modulation is independent of the information represented by said legacy amplitude modulation; and wherein at least one input parameter from said application host is adapted to select a profile of operation from a plurality of predefined profiles of operation.

2. The method according to claim 1, wherein each said profile is adapted to suit the common needs and constraints found in different types of devices.

3. The method according to claim 1, wherein said time information frame and said step of extracting enable said radio receiver to use the received signal differently depending on the reception conditions experienced thereby.

4. The method according to claim 1, wherein said broadcast signal comprises multiple representations for timing and time information provided alternately such that the information can be extracted from said broadcast signal in a manner optimal to the application host and the signal to interference and noise ratio (SINR) experienced by said radio receiver.

5. The method according to claim 1, wherein said broadcast signal comprises multiple representations for timing and time information provided simultaneously such that the information can be extracted from said broadcast signal in a manner optimal to the application host and the signal to interference and noise ratio (SINR) experienced by said radio receiver.

6. The method according to claim 1, wherein said profile is selected to optimize operation of said radio receiver based on reception conditions.

7. The method according to claim 1, wherein said profile is selected to optimize operation of said radio receiver based on a cost function that includes factors of importance for said particular type of application host.

8. The method according to claim 7, wherein said factors are selected from the group consisting of energy consumption, speed of acquiring the time from the received signal, timing accuracy, and probability of error in the extracted information.

9. The method according to claim 1, wherein said profile comprises a wrist-watch profile adapted to configure said radio receiver to minimize the frequency and duration of reception.

10. The method according to claim 1, wherein said profile comprises a car profile adapted to configure said radio receiver to attempt reception relatively frequently and permit reception in an extended reception mode.

11. The method according to claim 1, wherein said profile comprises an appliance profile adapted to configure said radio receiver to operate at a high duty cycle and permit reception in an extended reception mode.

12. A radio controlled clock (RCC), comprising:

a receiver coupled to an application host, said receiver operative to receive broadcast signal data frames comprising phase modulation (PM) over a legacy pulse width modulated (PWM)/amplitude modulated signal, said broadcast signal encoded with phase-modulated time and timing information, and extract said time and timing information from the phase of said received signal;

at least one profile adapted to operate said receiver in accordance with one or more parameters optimized for a particular type of application host;

wherein information represented by said phase modulation is independent of the information represented by said legacy amplitude modulation; and wherein at least one input parameter from said application host is adapted to select a profile of operation from a plurality of predefined profiles of operation.

13. The radio controlled clock according to claim 12, wherein said profile selected is operative to optimize operation of said RCC based on reception conditions.

14. The radio controlled clock according to claim 12, wherein said profile selected is operative to optimize operation of said RCC based on a cost function that includes factors of importance for said particular type of application host.

15. The radio controlled clock according to claim 14, wherein said factors are selected from the group consisting of energy consumption, speed of acquiring the time from the received signal, timing accuracy, and probability of error in the extracted information.

16. A radio receiver method, said method comprising:

receiving broadcast signal data frames comprising phase modulation (PM) over a legacy pulse width modulated (PWM)/amplitude modulated signal, said broadcast signal encoded with phase-modulated time and timing information;

extracting said time and timing information from the phase of said received signal;

operating said radio receiver in accordance with a predefined profile adapted for a particular type of application host;

adaptively attempting reception at multiple different symbol rates allowing for optimized reception for different conditions;

wherein information represented by said phase modulation is independent of the information represented by said legacy amplitude modulation; and wherein at least one input parameter from said application host is adapted to select a profile of operation from a plurality of predefined profiles of operation.

17. The method according to claim 16, further comprising complying with constraints set by an operating profile selected by said application host.

18. The method according to claim 16, wherein said different symbol rates may be provided simultaneously or alternately.

19. The method according to claim 16, wherein said different symbol rates carry the same or different amounts of information.

* * * * *